Figure 1:
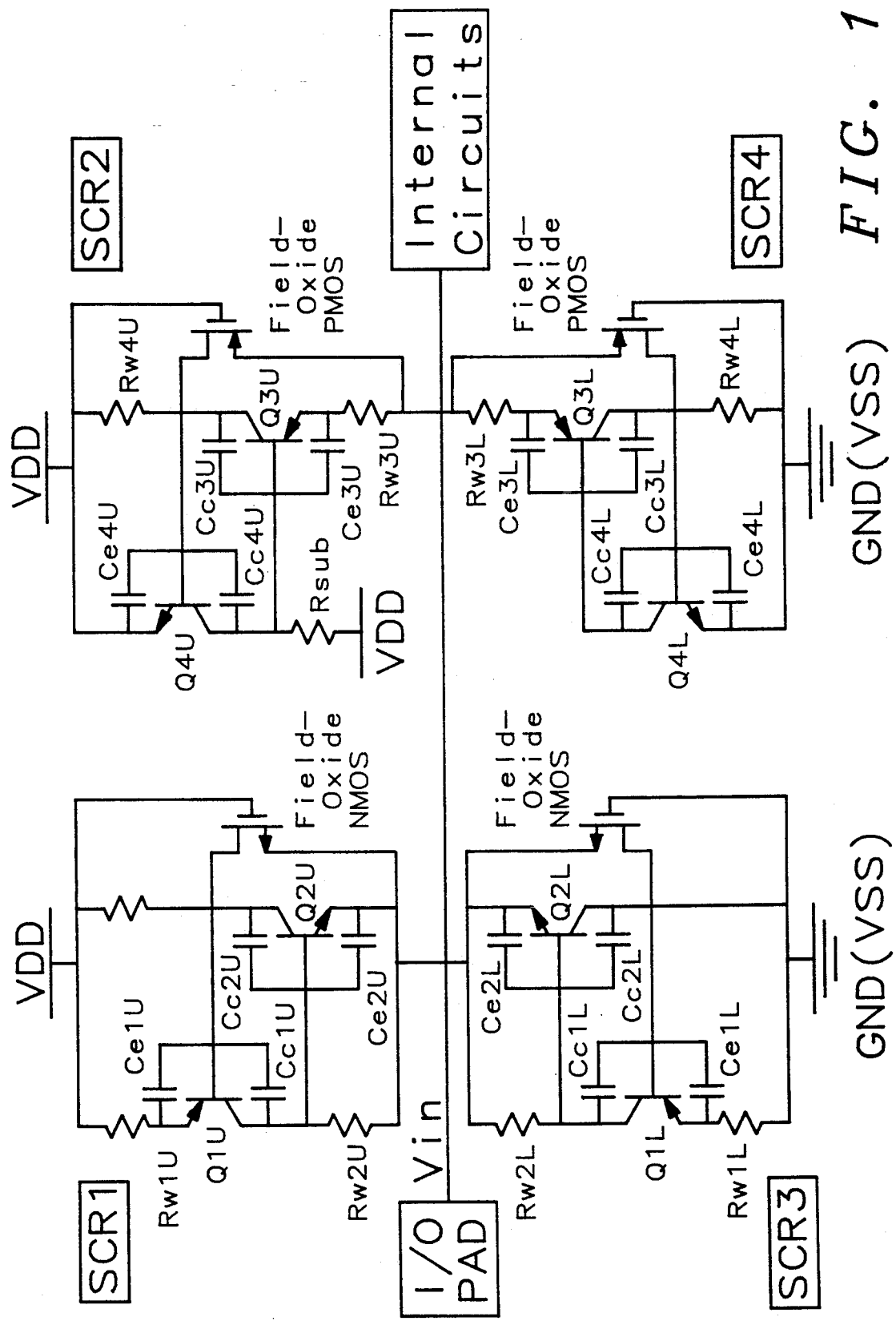

United States Patent [19]
Ker et al.

[11] Patent Number: 5,289,334
[45] Date of Patent: Feb. 22, 1994

[54] CMOS ON-CHIP ESD PROTECTION CIRCUIT AND SEMICONDUCTOR STRUCTURE

[75] Inventors: Ming-Dou Ker; Chung-Yuan Lee; Chung-Yu Wu, all of Hsinchu, Taiwan

[73] Assignee: United Microelectronics Corporation, Hsinchu, Taiwan

[21] Appl. No.: 978,332

[22] Filed: Nov. 18, 1992

Related U.S. Application Data

[62] Division of Ser. No. 863,693, Apr. 2, 1992, Pat. No. 5,182,220.

[51] Int. Cl.$^5$ .......................... H02H 9/00; H02H 3/22
[52] U.S. Cl. ......................... 361/56; 361/91; 361/111; 361/118
[58] Field of Search .................. 361/56, 91, 111, 119, 361/118

[56] References Cited

U.S. PATENT DOCUMENTS 4,484,244 11/1984 Avery ................................. 361/56
4,855,620 8/1989 Duvvury et al. ..................... 361/91

OTHER PUBLICATIONS

Chatterjee et al., 1990 Symposium on VLSI Techn., IEEE (1990), pp. 75–76.
Rountree, IEDM (1988), pp. 580–583.

*Primary Examiner*—A. D. Pellinen
*Assistant Examiner*—S. Jackson
*Attorney, Agent, or Firm*—George O. Saile; William S. Robertson

[57] ABSTRACT

A circuit for protecting a CMOS chip against damage from electrostatic discharges (ESD) has four SCRs connected between the line to be protected and the two power supply terminals, $V_{DD}$ and $V_{SS}$. The SCRs are poled to conduct ESD current of either polarity to each power supply terminal. The bipolar transistors for the SCRs and the associated components are arranged in the chip in an advantageous way that reduces the input-/output parasitic capacitance and improves the protection capability of this proposed circuit with a low ESD trigger-on voltage.

3 Claims, 1 Drawing Sheet

CMOS ON-CHIP ESD PROTECTION CIRCUIT AND SEMICONDUCTOR STRUCTURE

This application is a division of application Ser. No. 863,693, now U.S. Pat. No. 5,182,220 filed Apr. 1, 1992, which relates to a semiconductor structure that embodies this protection circuit.

FIELD OF THE INVENTION

This invention relates to a circuit for protecting other circuits from excessive voltages.

A RELATED APPLICATION

This specification is related to application Ser. No. 07/674,666 of M. D. Ker et al. entitled "CMOS ESD Protection Circuit with Parasitic SCR Structures", filed Mar. 25, 1991 and assigned to the assignee of this invention, now U.S. Pat. No. 5,140,401.

INTRODUCTION

The pads that interconnect a semiconductor chip with external circuits are commonly provided with protection circuits that turn on when an excessive voltage appears at a pad. The line that connects a pad to the protected circuits will be called the protected line. The protection circuits prevent the voltage from rising high enough to damage circuits that are connected to the pad. These circuits protect for example buffer circuits at an input pad and driver circuits at an output pad. The excessive voltages are commonly caused by an electrostatic discharge (ESD).

The related application describes CMOS device with a protection circuit that has silicon controlled rectifiers (SCRs). An SCR is connected between the protected line and each terminal of the power supply, $V_{DD}$ and $V_{SS}$.

An SCR has a PNP bipolar transistor and an NPN bipolar transistor that are interconnected so that the emitter-collector circuit of each transistor conducts the base current for the other. When either transistor is turned on, it turns on the other and both stay on until the current is interrupted. In the circuit of the related invention, an FET is connected to turn on one of the bipolar transistors when an excessive voltage appears on the protected line. Its source and drain terminals are connected to conduct in parallel with the emitter-collector circuit of one of the bipolar transistors and its source and gate terminals are connected between the line to be protected and one of the power supply terminals ($V_{DD}$ or $V_{SS}$), which forms a sink for the ESD current and also provides an extra triggering current to enhance the turn-on speed of the SCRs.

SCRs have several advantages: they can handle high current, they have a low turn-on impedance, they dissipate low power, and they have a large volume for heat dissipation. However because SCRs use bipolar transistors, they have been difficult to implement in CMOS technologies: they usually have a high turn-on voltage, which may be in the range that the circuits should protect against, but the turn-on voltage can be lowered by ESD transiently triggering with the proper circuit design on the device capacitances.

SUMMARY OF THE INVENTION

As in the related invention, the power supply terminals form sinks for the ESD current and also form voltage references for turning on the SCRs. One object of this invention is to provide an SCR protection circuit for each of the four combinations of ESD current polarity and power supply reference voltage. One SCR conducts positive ESD currents to $V_{SS}$ (as in the related invention), one conducts positive ESD currents to $V_{DD}$, one conducts negative ESD currents to $V_{SS}$ and one conducts negative ESD currents to $V_{DD}$ (as in the related invention).

Another object is to provide an improved semiconductor structure and an associated manufacturing process for making these components small and thereby reducing selected capacitances of the circuit. When certain capacitances are made smaller, the circuit can turn on at a lower ESD voltage.

The preferred semiconductor structure has an improved organization that permits the power supply terminals, $V_{SS}$ and $V_{DD}$, to be physically spaced apart on the chip, on opposite sides of the chip area designated for the protection circuit.

THE DRAWING

FIG. 1 is a schematic drawing of the protection circuit of this invention.

THE CIRCUIT—FIG. 1

The protection circuit protects circuits on the same chip and these circuits are shown for generality as a box "Internal Circuits". A protected line connects the internal circuits to an I/O pad where the internal circuits receive a signal Vin and where an ESD pulse can appear.

The protection circuit has four SCR circuits that are identified in the drawing as SCR1, SCR2, SCR3 and SCR4. SCR1 is similar to the upper SCR circuit in the related application, and it can be understood easily from a description of its operation.

SCR1: When the protected line receives a negative ESD pulse, SCR1 conducts the associated current to the positive terminal of the power supply, $V_{DD}$. The power supply terminals act as a sink for the ESD current, and (as will be explained) they also act as voltage references for turning on the SCRs.

The circuit path for this ESD current can be traced from $V_{DD}$ to $V_{SS}$ in separate paths through the two bipolar transistors that form this SCR, PNP transistor Q1u and NPN transistor Q2u (u for upper). (To look ahead in this description, Q1u is formed as a lateral transistor and Q2u is formed as a vertical transistor.) The path through Q1u comprises an emitter resistor Rw1u, the emitter-collector circuit of Q1u, and a collector resistor Rw2u. The path through Q2u comprises a collector resistor Rsub and the collector-emitter circuit of Q2u. When Q1u conducts, the voltage drop across its collector resistor Rw2u appears at the base terminal of transistor Q2u and turns on Q2u. When Q2u conducts, the voltage drop across its collector resistor Rsub appears at the base terminal of transistor Q1u and turns on Q1u.

A field-oxide n-channel FET has its source terminal connected to the emitter terminal of transistor Q2u and its drain terminal connected to the collector terminal of transistor Q2u, and when the FET turns on, it turns on transistor Q1u in the way has already been described for transistor Q2u. The gate terminal of the FET is connected to $V_{DD}$ so that the FET turns on when the protected line $V_{in}$ has a predetermined negative voltage with respect to $V_{DD}$.

SCR2: This SCR is connected between $V_{DD}$ and the protected line (like SCR1) and it turns on to protect the internal circuits when an ESD pulse on the protected line reaches a predetermined positive voltage with respect to $V_{DD}$ (unlike SCR1). Power supplies commonly have diodes that are poled in a direction to carry this current. NPN transistor Q4u has its emitter connected to $V_{DD}$ and its collector connected to the base of PNP transistor Q3u. A resistor Rw4u connects the collector of Q3u to $V_{DD}$ and a resistor Rw3u connects the emitter of Q3u to the protected line. A field-oxide p-channel FET has its source and drain terminals connected to conduct in parallel with the emitter-collector circuit of Q3u and its gate terminal connected to $V_{DD}$ to turn on when the protected line reaches a selected negative voltage with respect to $V_{DD}$.

SCR3 and SCR4: These SCRs are connected between the protected line and ground ($V_{SS}$). SCR3 is similar to SCR1 and it turns on when the protected line reaches a selected negative voltage with respect to $V_{SS}$. SCR4 is similar to SCR2 and turns on when the protected line reaches a selected positive voltage with respect to $V_{SS}$.

We claim:

1. A protection circuit for protecting an I/O pad and associated components on a CMOS chip from an excessive ESD voltage, where the chip has a negative power supply terminal ($V_{SS}$) and a positive power supply terminal ($V_{DD}$), wherein the improvement comprises,
   a first SCR circuit connected to conduct ESD currents of one polarity between the positive power supply terminal and the I/O pad,
   a second SCR circuit connected to conduct ESD currents of the other polarity between the positive power supply terminal and the I/O pad,
   a third SCR circuit connected to conduct ESD currents of said one polarity between the negative power supply terminal and the I/O pad, and
   a fourth SCR circuit connected to conduct ESD currents of said other polarity between the negative power supply terminal and the I/O pad,
   whereby the protection circuit operates for each polarity of ESD current in response to the magnitude of the ESD voltage with respect to the voltage of the power supply terminals.

2. The protection circuit of claim 1 wherein SCRs are formed with a small spacing between the anode and the cathode for providing a low turn-on voltage.

3. The protection circuit of claim 2 wherein the SCRs each comprise a vertical bipolar transistor and a lateral bipolar transistor.

* * * * *